United States Patent
Keates (10) Patent No.: US 9,947,905 B2
(45) Date of Patent: Apr. 17, 2018

(54) FABRIC BATTERY

(71) Applicant: INTEL CORPORATION, Santa Clara, CA (US)

(72) Inventor: Andrew W. Keates, Los Gatos, CA (US)

(73) Assignee: INTEL CORPORATION, Santa Clara, CA (US)

( * ) Notice: Subject to any disclaimer, the term of this patent is extended or adjusted under 35 U.S.C. 154(b) by 286 days.

(21) Appl. No.: 14/744,411

(22) Filed: Jun. 19, 2015

(65) Prior Publication Data

US 2016/0372718 A1    Dec. 22, 2016

(51) Int. Cl.
| | |
|---|---|
| *H01M 2/02* | (2006.01) |
| *H01M 10/04* | (2006.01) |
| *D02G 3/44* | (2006.01) |
| *D03D 1/00* | (2006.01) |
| *D03D 11/00* | (2006.01) |
| *D03D 15/00* | (2006.01) |
| *A41D 1/00* | (2018.01) |
| *A41D 13/00* | (2006.01) |
| *H05K 1/03* | (2006.01) |

(52) U.S. Cl.
CPC .......... *H01M 2/0275* (2013.01); *D02G 3/441* (2013.01); *D03D 1/0088* (2013.01); *D03D 11/00* (2013.01); *D03D 15/00* (2013.01); *H01M 10/0436* (2013.01); *A41D 1/002* (2013.01); *A41D 13/0015* (2013.01); *D10B 2401/16* (2013.01); *D10B 2401/18* (2013.01); *D10B 2501/00* (2013.01); *H01M 2220/30* (2013.01); *H05K 1/038* (2013.01); *H05K 2201/10037* (2013.01)

(58) Field of Classification Search
CPC ...... A41D 13/0015; A41D 1/002; A41B 1/00; A41B 1/0036; H02B 1/207
See application file for complete search history.

(56) References Cited

U.S. PATENT DOCUMENTS

| | | | |
|---|---|---|---|
| 4,929,803 A * | 5/1990 | Yoshida | ................. H01B 7/083 139/425 R |
| 5,531,601 A | 7/1996 | Amoroso | |

(Continued)

OTHER PUBLICATIONS

PCT/US2016/028142, International Search Report and Written Opinion, dated Jul. 29, 2016, 17 pages.

*Primary Examiner* — Tejash Patel
(74) *Attorney, Agent, or Firm* — Stoel Rives LLP (57) ABSTRACT

A battery includes a plurality of battery cells between first and second electrically conductive fabrics. The first electrically conductive fabric includes a first battery terminal. The second electrically conductive fabric includes a second battery terminal. The first electrically conductive fabric and the second electrically conductive fabric are framed to provide an enclosed region. The plurality of battery cells are arranged in parallel between the first electrically conductive fabric and the second electrically conductive fabric within the enclosed region. Each of the plurality of battery cells is configured to establish an electrical connection, at least temporarily, with the first battery terminal through the first electrically conductive fabric and the second battery terminal through the second electrically conductive fabric.

18 Claims, 6 Drawing Sheets

(56) References Cited

U.S. PATENT DOCUMENTS

| | | | |
|---|---|---|---|
| 5,906,004 A * | 5/1999 | Lebby | A41D 31/00 139/425 R |
| 2001/0047992 A1 | 12/2001 | Deangelis et al. | |
| 2007/0139003 A1 | 6/2007 | Paul | |
| 2008/0070105 A1 | 3/2008 | Marmaropoulos et al. | |
| 2008/0199770 A1 | 8/2008 | Marmaropoulos | |
| 2008/0220293 A1 | 9/2008 | Marmaropoulos et al. | |
| 2012/0202101 A1 | 8/2012 | Ueda | |
| 2014/0239065 A1 | 8/2014 | Zhou et al. | |
| 2015/0018733 A1* | 1/2015 | Ben-Meir | A61F 5/0104 602/6 |
| 2016/0284436 A1* | 9/2016 | Fukuhara | D03D 1/0088 |
| 2017/0007181 A1* | 1/2017 | Wang | A63B 71/10 |
| 2017/0181480 A1* | 6/2017 | Roh | A41D 1/002 |
| 2017/0288180 A1* | 10/2017 | Shin | H01M 2/0275 |

* cited by examiner

FIG. 10

FABRIC BATTERY

TECHNICAL FIELD

This disclosure relates to portable energy sources such as batteries, and more particularly to flexible and/or wearable batteries.

BACKGROUND

Electronic devices, including mobile platforms such as smartphones, laptops, notebook computers, and tablet computers, continue to shrink in size. A power delivery system, including one or more battery cells, is often among the largest components of a portable electronic device. As portable electronic devices shrink in size, users also expect that power delivery systems will grow smaller and more portable.

Carrying a handheld mobile device, such as a smart phone or tablet, may not always be convenient or comfortable. For example, wearable devices may be more useful during physical activity or leisure time. However, the small size of a wearable device may provide little space for a battery. Thus, many devices have low capacity batteries that restrict their useful lifetime between recharging periods. Generally, batteries exist as a bulky, rigid object. Because clothing is pliable in two dimensions, bulky and/or rigid batteries do not incorporate well into clothing.

BRIEF DESCRIPTION OF THE DRAWINGS

Arrangements and embodiments may be described in detail with reference to the following drawings, in which like reference numerals refer to like elements and wherein.

DETAILED DESCRIPTION OF EMBODIMENTS

Embodiments and arrangements disclosed herein include a matrix of small battery cells assembled into a fabric framework to provide a two-dimensional flexible battery that may be assimilated into a garment. Thus, as compared to conventional bulky and/or rigid batteries, the embodiments disclosed herein are more comfortable to the wearer of the garment and add versatility in the way in which a battery may be assimilated into the garment.

In certain embodiments, the battery cells are constructed in a manner that allows them to be assembled into a matrix. The small battery cells may be any shape (e.g., circular, square, rectangular, etc.) or size. For example, individual battery cells may be manufactured as hexagons with positive and negative terminals on opposite faces. In certain embodiments, all of the battery cells have the same shape. In other embodiments, one or more of the battery cells may have a different shape and/or size than that of the other battery cells. The battery cells are arranged in a matrix to form a sheet. The matrix is then sandwiched between two layers of electrically conductive fabric. The resulting two-dimensional fabric battery can be used in clothing (e.g., pants, shirt, wrist band, hat, etc.). Similar to clothing in general, panels of electrically conductive fabric may be cut with a specific fit in mind. In certain embodiments, use of a stretchy fabric may enable the battery comprising the matrix to adapt to the contour of a body part.

The battery cells may be separated from one another by direct attachment to the top and/or bottom electrically conductive fabric, and/or may be located in a series of pouches. In other embodiments, a plurality of battery cells may be located together within a pocket or fabric framing without being attached to either the top or bottom fabric. With many battery cells in parallel (e.g., two, tens, hundreds, or more), sufficient electrical contact with every battery cell is not necessary in certain embodiments. That is to say, at any point in time, a sufficient number of battery cells are in contact with the electrically conductive surfaces of the fabric to operate a desired device. Further, due to the battery cells in the matrix being in parallel, battery cells with less electrical contact self-balance with other battery cells having more electrical contact. Except in the case of a short circuit within a battery cell (which may be extremely rare), a single dead battery cell has little or no effect on the performance of the whole battery.

Figure 1:
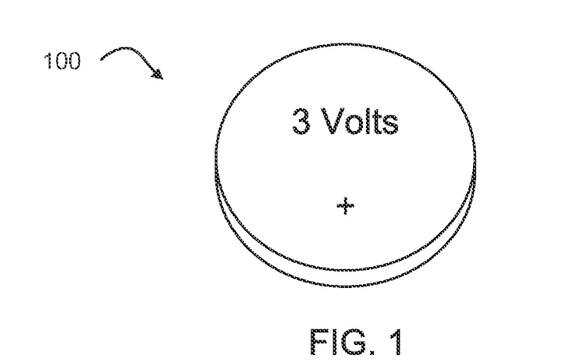
FIG. 1 illustrates a coin shape Li-ion battery that may be used with certain embodiments.

Various types of battery cells may be used according to certain embodiments. For example, FIG. 1 illustrates a coin shape Li-ion battery 100 that uses a liquid electrolyte and is packaged in a rigid, hermetically sealed metal "can" housing. The coin shape Li-ion battery 100, however, can add overhead to the fabric battery in terms of both size and weight. Further, the can housing limits energy density, particularly in multi-cell packs where placing cylindrical cells side by side creates gaps of empty space. The coin shape Li-ion battery 100 may have a positive electrode including a lithium manganese composite oxide and a negative electrode including a lithium aluminum alloy and having a voltage of approximately 3V. As another example, a coin shape lithium secondary battery with a positive electrode including niobium pentoxide and a negative electrode including a lithium aluminum alloy and having a voltage of approximately 2.5 V may been used.

A problem with lithium batteries, such as that shown in FIG. 1, is that liquid electrolyte is extremely flammable. High temperature atmospheres, such as those used with domestic or commercial wash and/or tumble dry machines, can cause high pressure to build within the can housing of the coin shape Li-ion battery 100 such that it either vents electrolyte or explodes. In a high temperature atmosphere, the electrolyte can flame as it is vented. Attempts to make the volatile liquid electrolyte less flammable to allow for surface-mount coin cells, have generally resulted in battery cells with very low capacities (e.g., up to about 2.5 mAh). Thus, certain embodiments discussed below use battery cells configured to withstand wash and tumble dry cycles.

Figure 2A:
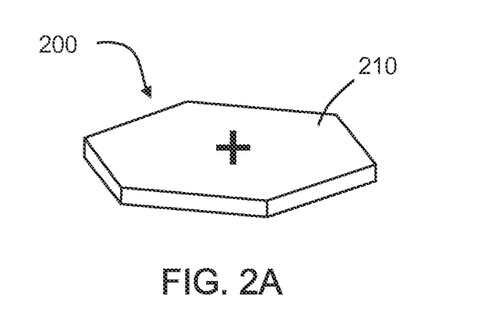
FIGS. 2A and 2B illustrate a battery cell having a hexagonal shape according to one embodiment.
Figure 2B:
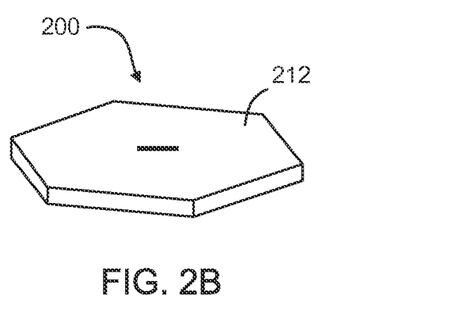

FIGS. 2A and 2B illustrate a battery cell 200 having a hexagonal shape according to one embodiment. The hexagonal shape allows a plurality of battery cells to be oriented closer together within a confined space of a two-dimensional matrix (see FIG. 3), as compared to using battery cells with circular or other shapes. FIG. 2A shows a first side 210 of the battery cell 200 configured as a positive (+) battery terminal (i.e., cathode current collector). FIG. 2B shows a second side 212 of the battery cell 200 configured as a negative (−) battery terminal (i.e., an anode current collector).

Figure 3:
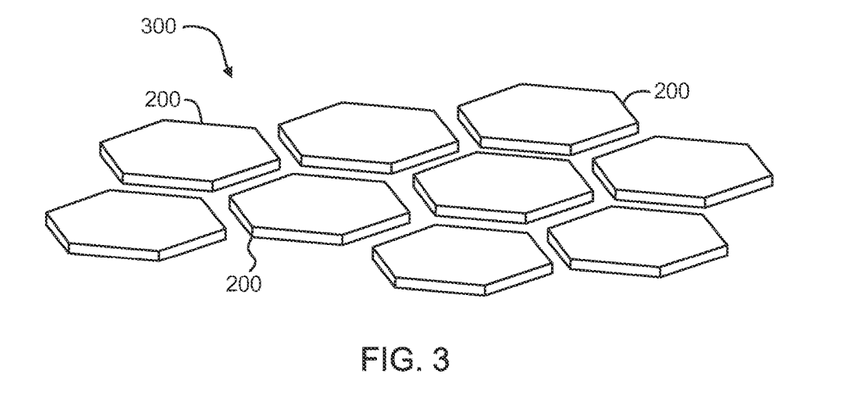
FIG. 3 illustrates a matrix of battery cells according to one embodiment.

FIG. 3 illustrates a matrix 300 of battery cells 200 according to one embodiment. In this example, the matrix 300 includes the hexagonally shaped battery cells 200 shown in FIGS. 2A and 2B. Thus, the matrix 300 may be referred to as a honeycomb matrix. Persons skilled in the art will recognize from the disclosure herein, however, that other embodiments may use battery cells having other shapes. Further, while nine battery cells 200 are shown for illustrative purposes, persons skilled in the art will recognize from the disclosure herein that fewer or more battery cells 200 may be used in other embodiments. The plurality of battery cells 200 are arranged in parallel within the matrix 300. That is to say, for example, that the positive terminal of each battery cell 200 is facing up and the negative terminal of each battery cell 200 is facing down in FIG. 3, or vice versa.

Figure 4:
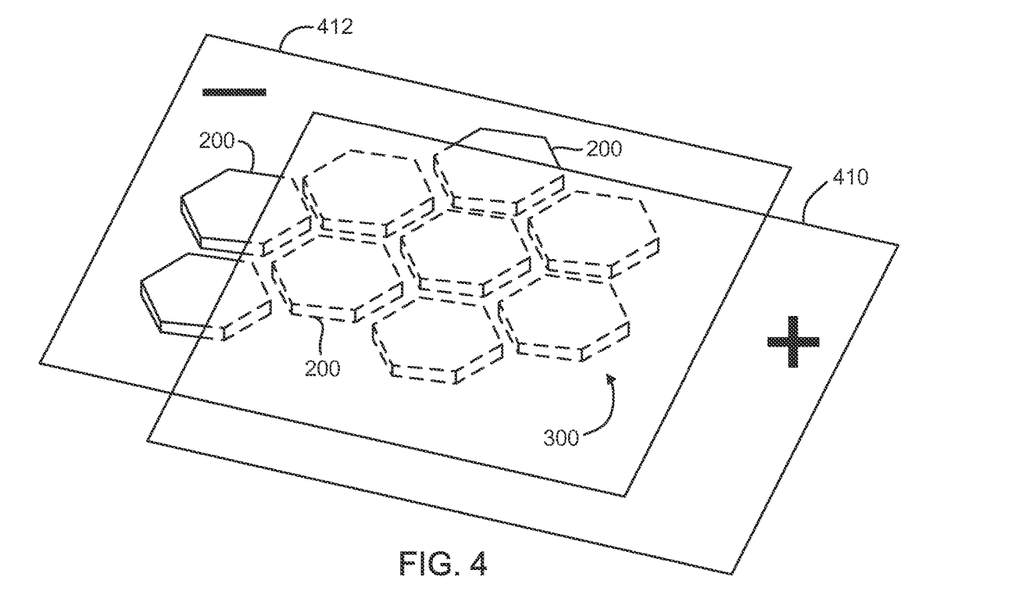
FIG. 4 illustrates a matrix of battery cells between a first electrically conductive fabric and a second electrically conductive fabric according to one embodiment.

FIG. 4 illustrates a matrix 300 of battery cells 200 between a first electrically conductive fabric 410 and a second electrically conductive fabric 412 according to one embodiment. In this example, the matrix 300 includes the matrix shown in FIG. 3, wherein the positive terminal (the first side 210 shown in FIG. 2A) of each battery cell 200 is facing toward the first electrically conductive fabric 410, and the negative terminal (the second side 212 shown in FIG. 3) of each battery cell 200 is facing toward the second electrically conductive fabric 412. Thus, the first electrically conductive fabric 410 may be referred to herein as a positive (+) layer, and the second electrically conductive fabric 412 may be referred to herein a negative (−) layer. As discussed above, use of more battery cells 200, or more closely spaced battery cells 200, may increase the number of battery cells 200 in electrical contact with the positive layer and/or the negative layer at any given time.

The first electrically conductive fabric 410 and the second electrically conductive fabric 412 may each include, for example, flexible metallic layers, electrically conductive traces formed or deposited on one side of a fabric (e.g., cotton, wool, polyester, silk, etc.), and/or electrically conductive wires attached to one side of the fabric. In certain embodiments, the first electrically conductive fabric 410 and/or the second electrically conductive fabric 412 comprises an electrically conductive strand (e.g., copper, silver, gold, etc.) woven into the fabric so as to make electrical contact with the matrix 300 of battery cells 200.

Figure 5A:
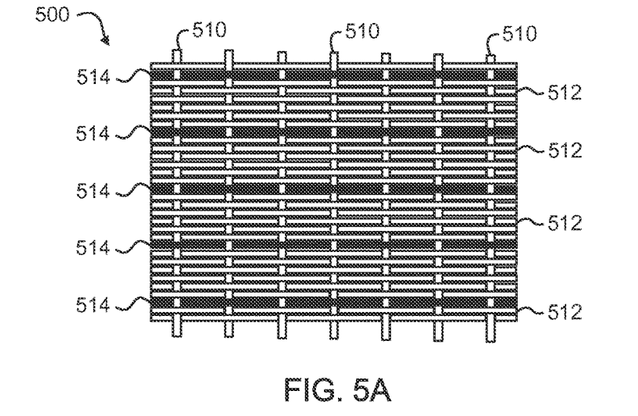
FIGS. 5A and 5B illustrate an example electrically conductive fabric according to one embodiment.
Figure 5B:
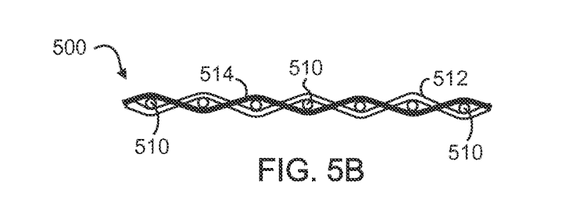

For example, FIGS. 5A and 5B illustrate an example electrically conductive fabric 500 according to one embodiment. FIG. 5A illustrates a top view of the electrically conductive fabric 500 including a plurality of first fabric strands 510 (shown in a vertical direction) woven with a plurality of second fabric strands 512 (shown in a horizontal direction). In certain embodiments, the first fabric strands 510 and the second fabric strands 512 are electrical insulators (i.e., non-electrically conductive). The first fabric strands 510 and the second fabric strands 512 may include, for example, cotton, wool, polyester, silk, combinations of the foregoing, and/or other electrically insulating materials.

The electrically conductive fabric 500 further includes a plurality of electrically conductive strands 514 woven among the first fabric strands 510 and the second fabric strands 512. FIG. 5B illustrates a side view of the electrically conductive fabric 500 including an electrically conductive strand 514 woven among the first fabric strands 510 and the second fabric strands 512. In the example shown in FIGS. 5A and 5B, the electrically conductive strands 514 are woven perpendicular to the first fabric strands 510 and parallel to the second fabric strands 512. The present disclosure, however, is not so limited. Indeed, persons skilled in the art will recognize from the disclosure herein that the electrically conductive strands 514 may be woven perpendicular to the first conductive strands 510, horizontal to the first conductive strands 510, at an angle to the first conductive strands 510, and/or a combination of the foregoing. Further, persons skilled in the art will recognize from the disclosure herein that the ratio of electrically conductive strands 514 to non-electrically conductive strands (the first fabric strands 510 and the second fabric strands 512) and/or the spacing between the plurality of electrically conductive strands 514 may be selected based on a particular fabric battery application and/or arrangement and spacing of the battery cells 200 within the matrix 300 shown in FIG. 4.

Figure 6A:
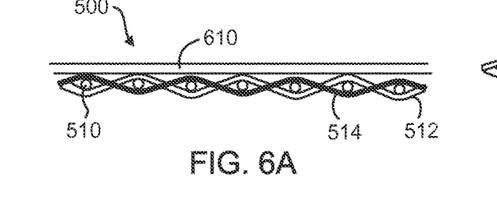
FIG. 6A is a side view of the electrically conductive fabric shown in FIGS. 5A and 5B including a covering according to certain embodiments.
Figure 6B:
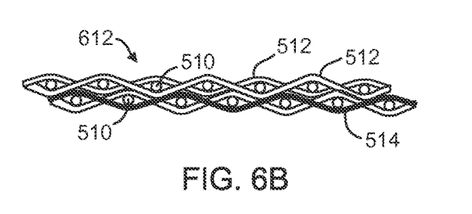
FIG. 6B is a side view of an electrically conductive fabric including multiple layers of the first fabric strands and the second fabric strands according to one embodiment.

In certain embodiments, the electrically conductive strands 514 are only exposed on a single side of the electrically conductive fabric 500. For example, FIG. 6A is a side view of the electrically conductive fabric 500 shown in FIGS. 5A and 5B including a covering 610 according to certain embodiments. The covering 610 may be sewn, glued, or otherwise affixed to a side of the electrically conductive fabric 500 such that the electrically conductive strands 514 are only exposed on the opposite side of the electrically conductive fabric 500. In certain such embodiments, the covering 610 is an electrical insulator and may be moisture proof or moisture resistant to reduce or avoid the conduction of electricity through moisture (e.g., sweat) between the electrically conductive strands 514 and a user. In another example, FIG. 6B is a side view of an electrically conductive fabric 612 including multiple layers of the first fabric strands 510 and the second fabric strands 512 according to one embodiment. In this example, the electrically conductive strands 514 are woven into a first side of the electrically conductive fabric 612 without being exposed on a second side of the electrically conductive fabric 612.

Figure 7A:
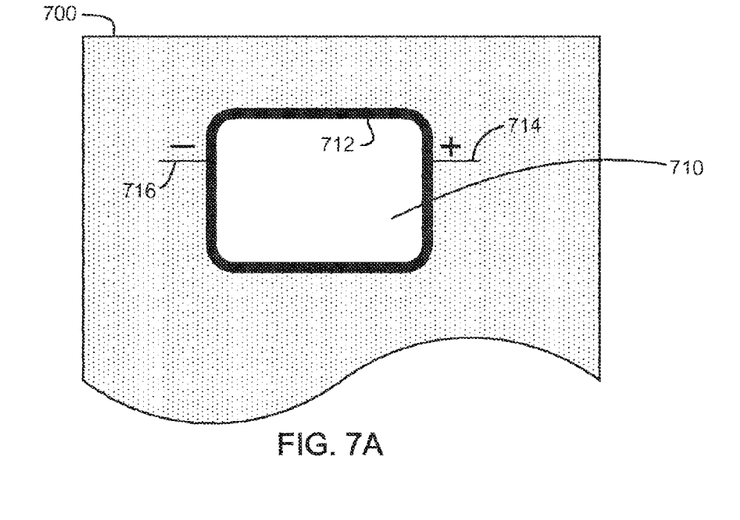
FIGS. 7A, 7B, and 7C illustrate a flexible fabric including a fabric battery according to certain embodiments.
Figure 7B:
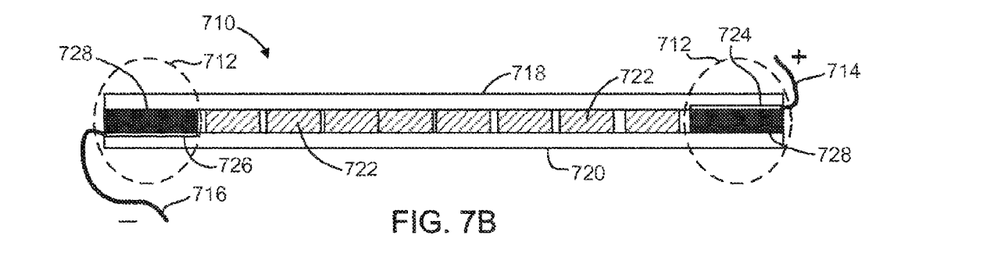
Figure 7C:
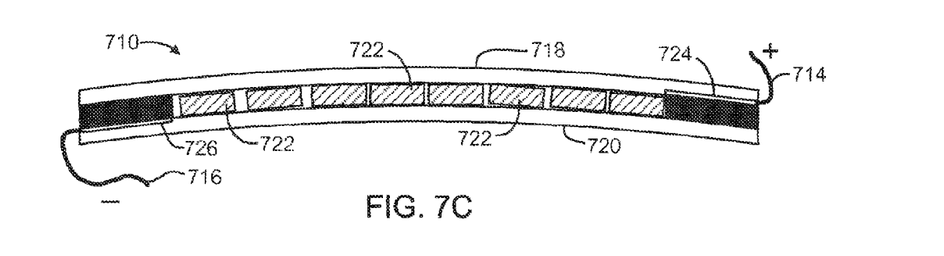

FIGS. 7A, 7B, and 7C illustrate a flexible fabric 700 including a fabric battery 710 according to certain embodiments. The flexible fabric 700 may comprise, for example, any type of fabric used for making garments. Accordingly, the flexible fabric 700 may be sewable. In some embodiments, the flexible fabric 700 is stretchable. The fabric battery 710 is attached to the flexible fabric 700 in an attachment region 712. For example, the fabric battery 710 may be sewn onto the flexible fabric 700. In such embodiments, another layer of flexible fabric (not shown) may be attached at the attachment region 712, such that the fabric battery 710 is positioned between two layers of a garment. As another example, the flexible fabric 700 may include a cutout region corresponding to the size and shape of the fabric battery 710, and the fabric battery 710 may be sewn or otherwise attached to the flexible fabric 700 in the attachment region 712 so as to fill the cutout region. The fabric battery 710 includes a first electrically conductive wire 714 and a second electrically conductive wire 716 that may each extend onto or within the flexible fabric 700. Although shown on opposite sides of the fabric battery 710, the first electrically conductive wire 714 and the second electrically conductive wire 716 may be located on the same side or adjacent sides of the fabric battery 710.

FIGS. 7B and 7C are cross-sectional side views of the fabric battery 710 shown in FIG. 7A according to certain embodiments. In this example, the fabric battery 710 includes a first electrically conductive fabric 718 and a second electrically conductive fabric 720 encasing a plurality of battery cells 722. The attachment region 712 provides a framing within which the plurality of battery cells 722 are enclosed. While the cross-sectional views in FIGS. 7B and 7C show a single array of battery cells 722, the plurality of battery cells 722 may be arranged in a two dimensional matrix, as shown in FIGS. 3 and 4. Further, each battery cell 722 may be any shape, including a hexagonal shape.

The positive terminal of each battery cell 722 is facing toward the first electrically conductive fabric 718, and the negative terminal of each battery cell 722 is facing toward the second electrically conductive fabric 720. Thus, a positive terminal 724 electrically couples the first electrically conductive fabric 718 to the first electrically conductive wire 714, and a negative terminal 726 electrically couples the second electrically conductive fabric 720 to the second electrically conductive wire 716. As shown in FIG. 7B, the attachment region 712 includes an electrically insulating material 728 to prevent a short circuit between the positive terminal 724 and the negative terminal 726. In the embodiment discussed above wherein the flexible fabric 700 includes a cutout region, for example, the electrically insulating material 728 may comprise the flexible fabric 700. In other embodiments, the electrically insulating material 728 comprises a separate element.

In certain embodiments, one or more of the plurality of battery cells 722 is affixed to the first electrically conductive fabric 718, the second electrically conductive fabric 720, or both. In other embodiments, however, the plurality of battery cells 722 are not affixed to either the first electrically conductive fabric 718 or the second electrically conductive fabric 720 such that the spacing between respective battery cells 722 may change as the flexible fabric 700 and the fabric battery 710 stretches or bends. For example, the fabric battery 710 shown in FIG. 7C is flexed or bent, as compared to that shown in FIG. 7B. Accordingly, the spacing between the plurality of battery cells 722 is different in FIG. 7C than it is in FIG. 7B. Further, one or more of the battery cells 722 shown in FIG. 7C do not have the same physical and/or electrical contact with the first electrically conductive fabric 718, the second electrically conductive fabric 720, or both. As discussed above, however, a sufficient number of battery cells 722 remain in contact with the first electrically conductive fabric 718 and the second electrically conductive fabric 720 to operate a device (not shown) electrically coupled to the first electrically conductive wire 714 and the second electrically conductive wire 716.

Figure 8:
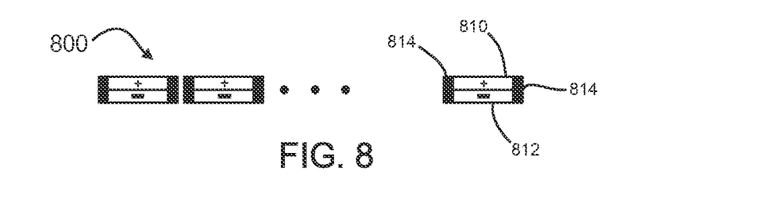
FIG. 8 is a cross-sectional side view of a plurality of battery cells according to one embodiment.

Because the plurality of battery cells 722 may shift in three dimensions relative to one another, certain embodiments provide electrical isolation between adjacent cells. For example, FIG. 8 is a cross-sectional side view of a plurality of battery cells 800 according to one embodiment. Each cell includes a positive terminal 810 and a negative terminal 812 surrounded by an electrical isolator 814. The electrical isolator 814 reduces or prevents the positive terminal 810 of one cell from directly contacting the negative terminal 812 of an adjacent cell.

Figure 9A:
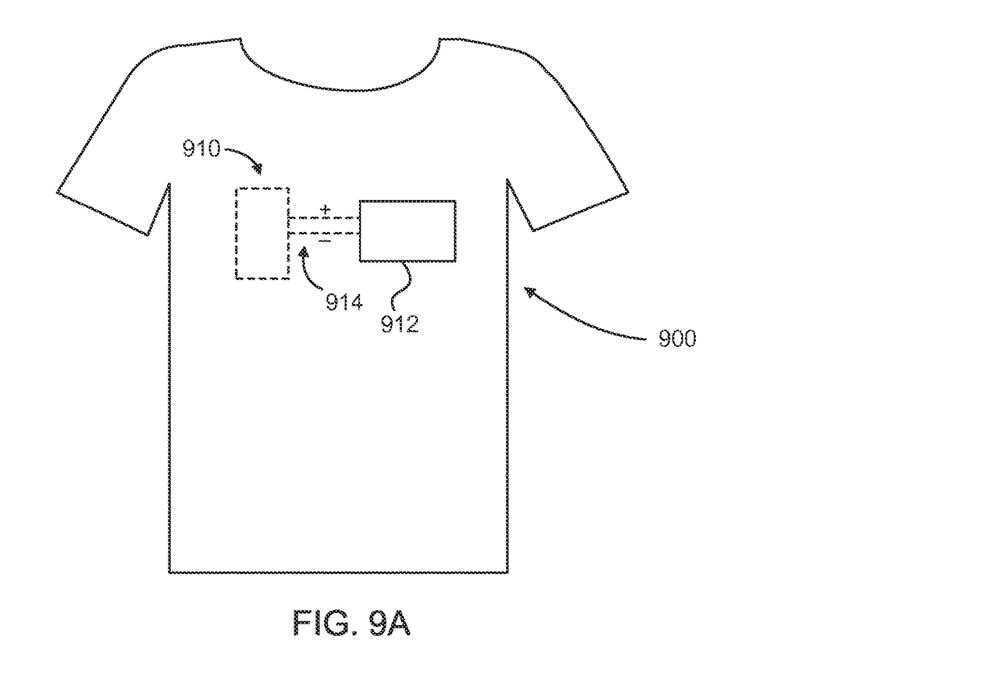
FIG. 9A illustrates a garment including a fabric battery electrically coupled to a mobile device according to one embodiment.

FIG. 9A illustrates a garment 900 including a fabric battery 910 electrically coupled to a mobile device 912 according to one embodiment. The mobile device 912 may also be referred to herein as an electrical load. In this example, the garment 900 comprises a shirt. However, any type of garment may be used. The fabric battery 900 is integrated with the fabric of the garment 900, as described in various embodiments herein. The mobile device 912 may also be integrated with the fabric of the garment, or the mobile device 912 may be a separate and interchangeable device. In addition, or in other embodiments, the fabric battery 900 may be configured to simultaneously establish an electrical connection with a plurality of devices integrated with the garment 900, external devices, or a combination of integrated and external devices.

Figure 9B:
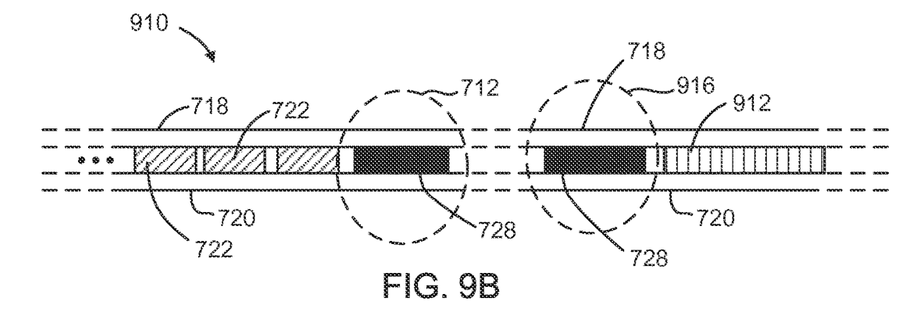
FIG. 9B is a cross-sectional side view illustrating portions of the fabric battery and mobile device shown in FIG. 9A according to certain embodiments.

FIG. 9A shows a positive (+) and negative (−) electrical coupling 914 of the fabric battery 910 to the mobile device 912. The electrical coupling 914 may be provided in various ways. For example, the electrical coupling 914 may include wires such as the first electrically conductive wire 714 and the second electrically conductive wire 716 shown in FIGS. 7A-7C. In another embodiment, the electrical coupling 914 comprises the positive (+) layer and the negative (−) layer of the fabric battery 910 that couples directly to, or is integrated with, the mobile device 912. For example, FIG. 9B is a cross-sectional side view illustrating portions of the fabric battery 910 and mobile device 912 shown in FIG. 9A according to certain embodiments. Similar to the embodiment shown in FIG. 7B, the fabric battery 910 includes a plurality of battery cells 722 arranged in parallel between a first electrically conductive fabric 718 and a second electrically conductive fabric 720. As shown in FIG. 9B, all or at least a portion (e.g., power input terminals) of the mobile device 912 is located between, and is configured to electrically couple to, the first electrically conductive fabric 718 and the second electrically conductive fabric 720. That is to say, the first electrically conductive fabric 718 and the second electrically conductive fabric 720 extend beyond the attachment region 712 including the electrically insulating material 728 to at least a portion of the mobile device 912 configured to draw current from the fabric battery 910.

The electrically insulating material 728 may also extend from the attachment region 712 of the fabric battery 910 to an attachment region 916 of at least a portion of the mobile device 912 to provide electrical isolation between the first electrically conductive fabric 718 and the second electrically conductive fabric 720. In other embodiments, however, one or more electrically conductive strands, such as the electrically conductive strands 514 shown in FIG. 5A, are woven so as to be electrically exposed in the areas of the plurality of battery cells 722 and the mobile device 912, but not electrically exposed in the area between the fabric battery 910 and the mobile device 912. In such embodiments, the electrically conductive material 728 may not extend from the attachment region 712 to the attachment region 916.

Figure 10:
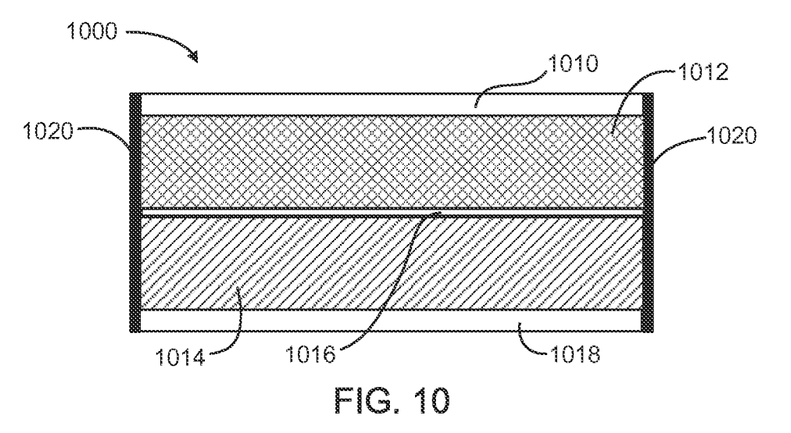
FIG. 10 illustrates a cross-section of a battery cell using a solid state electrolyte that may be used with a fabric battery according to one embodiment.

To withstand tumble dry cycles used for cleaning and maintenance of garments and other fabrics, certain embodiments use battery cells using a solid state electrolyte. For example, FIG. 10 illustrates a cross-section of a battery cell 1000 using a solid state electrolyte that may be used with a fabric battery according to one embodiment. The metal foam includes active ingredients in the pores of the foam and the metal foam may be formed into any desired shape (e.g., a hexagon). The battery cell 1000 includes a cathode current collector 1010 comprising an electrically conductive material (e.g., copper). The cathode current collector 1010 is formed on a cathode 1012 comprising a metal mesh including metal fibers (e.g., copper) immersed in cathode active material. The battery cell 1000 further includes an anode 1014 separated from the cathode 1012 by a separator 1016. The separator 1016 may serve as an electrolyte that passes ions between the anode 1014 and the cathode 1012. The anode 1014 comprises an anode active material. In one embodiment, the anode 1014 also comprises a metal mesh including metal fibers (e.g., copper) that are immersed in anode active material. An anode current collector 1018 is formed on the anode 1014 using an electrically conductive material (e.g., copper). At least one of the cathode current collector 1010 and the anode current collector 1018 may be formed using, for example, laser ablation, chemical vapor deposition, sputtering, spraying (e.g., flame spraying), electroplating, or a combination of the foregoing. In certain embodiments, the battery cell 1000 further includes an electrical insulator 1020 to reduce or prevent shorting of cathodes to anodes between adjacent cells in a fabric battery.

Example Embodiments

The following are examples of further embodiments. Examples may include subject matter such as a fabric battery, garment, method, means for performing acts of the method, or of at least one machine-readable medium including instructions that, when performed by a machine cause the machine to perform acts of the method according to the embodiments and examples described herein.

Example 1 is a fabric battery, comprising a first electrically conductive fabric including a first battery terminal, and a second electrically conductive fabric including a second battery terminal. The first electrically conductive fabric and the second electrically conductive fabric are framed to provide an enclosed region. The fabric battery further comprises a plurality of battery cells arranged in parallel between the first electrically conductive fabric and the second electrically conductive fabric within the enclosed region. Each of the plurality of battery cells is configured to establish an electrical connection, at least temporarily, with the first battery terminal through the first electrically conductive fabric and the second battery terminal through the second electrically conductive fabric.

Example 2 includes the subject matter of Example 1, wherein at least one of the first electrically conductive fabric and the second electrically conductive fabric comprises one or more electrically conductive strands woven together with a plurality of non-electrically conductive strands.

Example 3 includes the subject matter of any of Examples 1-2, wherein the one or more electrically conductive strands are electrically exposed to the plurality of battery cells within the enclosed region.

Example 4 includes the subject matter of any of Examples 1-3, wherein the first electrically conductive fabric and the second electrically conductive fabric are flexible.

Example 5 includes the subject matter of Example 4, wherein the plurality of battery cells are loose within the enclosed region such that relative distances between adjacent battery cells change as the first electrically conductive fabric and the second electrically conductive fabric flex.

Example 6 includes the subject matter of any of Examples 1-5, wherein the first electrically conductive fabric and the second electrically conductive fabric are stretchable.

Example 7 includes the subject matter of any of Examples 1-4, wherein at least one of the plurality of battery cells is affixed to at least one of the first electrically conductive fabric and the second electrically conductive fabric.

Example 8 includes the subject matter of any of Examples 1-7, wherein at least one of the plurality of battery cells comprises a hexagonal shape.

Example 9 includes the subject matter of any of Examples 1-8, wherein the plurality of battery cells are arranged in a two-dimensional matrix.

Example 10 includes the subject matter of any of Examples 1-8, wherein the two-dimensional matrix comprises a honeycomb pattern matrix.

Example 11 includes the subject matter of any of Examples 1-10, further comprising a frame of electrically insulating material attached to the first electrically conductive fabric and the second electrically conductive fabric to form the enclosed region.

Example 12 includes the subject matter of any of Examples 1-11, wherein the first electrically conductive fabric and the second electrically conductive fabric are shaped, sized, and configured to form part of a garment.

Example 13 includes the subject matter of any of Examples 1-12, wherein each of the plurality of battery cells comprises a solid state electrolyte configured to withstand tumble dry cycles for garments.

Example 14 is a method for manufacturing a battery. The method comprises providing a first electrically conductive fabric, arranging a plurality of battery cells in parallel in a two-dimensional matrix on the first electrically conductive fabric, and covering the two-dimensional matrix with a second electrically conductive fabric. Each of the first electrically conductive fabric and the second electrically conductive fabric comprises a flexible and sewable material. The method further includes framing the two-dimensional matrix between the first electrically conductive fabric and the second electrically conductive fabric, to prevent direct electrical contact between the first electrically conductive fabric and the second electrically conductive fabric, and to allow the plurality of battery cells to establish electrical connections to the first electrically conductive fabric and the second electrically conductive fabric.

Example 15 includes the subject matter of Example 14, wherein the method further includes electrically coupling a first terminal to the first electrically conductive fabric; and electrically coupling a second terminal to the second electrically conductive fabric.

Example 16 includes the subject matter of any of Examples 14-15, wherein the framing comprises affixing an electrically insulating material between the first electrically conductive fabric and the second electrically conductive fabric to enclose the two-dimensional matrix.

Example 17 includes the subject matter of Example 16, wherein the affixing comprises sewing the electrically insulating material between the first electrically conductive fabric and the second electrically conductive fabric within an attachment region.

Example 18 includes the subject matter of any of Examples 14-17, further comprising integrating the battery into a garment.

Example 19 is a garment comprising a non-electrically conducting fabric, and a fabric battery affixed to the non-electrically conducting fabric. The non-electrically conducting fabric and the fabric battery cooperate to form an article of clothing wearable by a user. The fabric battery includes a first electrically conductive fabric, a second electrically conductive fabric, and a plurality of battery cells arranged in parallel between the first electrically conductive fabric and the second electrically conductive fabric within an enclosed region.

Example 20 includes the subject matter of Example 19, wherein at least one of the first electrically conductive fabric and the second electrically conductive fabric comprises one or more electrically conductive strands woven into a plurality of non-electrically conductive strands.

Example 21 includes the subject matter of any of Examples 19-20, wherein the non-electrically conducting fabric, the first electrically conductive fabric, and the second electrically conductive fabric are stretchable.

Example 22 includes the subject matter of any of Examples 19-21, wherein at least one of the plurality of battery cells is affixed to at least one of the first electrically conductive fabric and the second electrically conductive fabric.

Example 23 includes the subject matter of any of Examples 19-22, further comprising a frame of electrically insulating material attached to the first electrically conductive fabric and the second electrically conductive fabric to form the enclosed region.

Example 24 includes the subject matter of any of Examples 19-23, further comprising a mobile device electrically coupled to the fabric battery.

Example 25 includes the subject matter of Example 24, wherein at least a portion of the mobile device is integrated with the garment between the first electrically conductive fabric and the second electrically conductive fabric so as to establish an electrical connection for drawing power from the fabric battery.

Example 26 is a machine-readable storage including machine-readable instructions, when executed, to implement a method as recited in any of Examples 14-18.

Example 27 is a device comprising first flexible means for conducting electricity, second flexible means for conducting electricity, a plurality of storage means for storing power, and means for containing the plurality of storage means between the first flexible means for conducting electricity and the second flexible means for conducting electricity. The plurality of storage means is configured to establish electrical connections with the first flexible means and the second flexible means for providing electrical power.

Example 28 includes the subject matter of Example 27, further comprising coupling means for electrically coupling the first flexible means and the second flexible means to an electrical load.

Example 29 includes the subject matter of any of Examples 27-28, further comprising insulating means for preventing direct electrical contact between the first flexible means and the second electrical means.

Example 30 includes the subject matter of any of Examples 27-29, wherein at least one of the first flexible means and the second flexible means are stretchable.

Example 31 includes the subject matter of any of Examples 27-30, further comprising means to affix the plurality of storage means to at least one of the first flexible means and the second flexible means.

Example 32 is an article of clothing comprising the device of any of Examples 27-31.

Example 33 includes the subject matter of Example 32, further comprising at least a portion of the electrical load integrated with the first flexible means and the second flexible means.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. might be used herein only to facilitate discussion, and carry no particular temporal or chronological significance unless otherwise indicated.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Various embodiments may be implemented using hardware elements, software elements, and/or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art. The scope of the present invention should, therefore, be determined only by the following claims.

The invention claimed is:

1. A fabric battery, comprising:
   a first electrically conductive fabric comprising a first battery terminal;
   a second electrically conductive fabric comprising a second battery terminal, the first electrically conductive fabric and the second electrically conductive fabric framed to provide an enclosed region; and
   a plurality of battery cells electrically connected in parallel between the first electrically conductive fabric and the second electrically conductive fabric within the enclosed region, each of the plurality of battery cells configured to establish an electrical connection, at least temporarily, with the first battery terminal through the first electrically conductive fabric and the second battery terminal through the second electrically conductive fabric.

2. The fabric battery of claim 1, wherein at least one of the first electrically conductive fabric and the second electrically conductive fabric comprises one or more electrically conductive strands woven together with a plurality of non-electrically conductive strands.

3. The fabric battery of claim 2, wherein the one or more electrically conductive strands are electrically exposed to the plurality of battery cells within the enclosed region.

4. The fabric battery of claim 1, wherein the first electrically conductive fabric and the second electrically conductive fabric are flexible.

5. The fabric battery of claim 4, wherein the plurality of battery cells are loose within the enclosed region such that relative distances between adjacent battery cells change as the first electrically conductive fabric and the second electrically conductive fabric flex.

6. The fabric battery of claim 1, wherein the first electrically conductive fabric and the second electrically conductive fabric are stretchable.

7. The fabric battery of claim 1, wherein at least one of the plurality of battery cells is affixed to at least one of the first electrically conductive fabric and the second electrically conductive fabric.

8. The fabric battery of claim 1, wherein at least one of the plurality of battery cells comprises a hexagonal shape.

9. The fabric battery of claim 1, wherein the plurality of battery cells are arranged in a two-dimensional matrix.

10. The fabric battery of claim 9, wherein the two-dimensional matrix comprises a honeycomb pattern matrix.

11. The fabric battery of claim 1, further comprising a frame of electrically insulating material attached to the first electrically conductive fabric and the second electrically conductive fabric to form the enclosed region.

12. The fabric battery of claim 1, wherein the first electrically conductive fabric and the second electrically conductive fabric are shaped, sized, and configured to form part of a garment.

13. The fabric battery of claim 1, wherein each of the plurality of battery cells comprises a solid state electrolyte configured to withstand tumble dry cycles for garments.

14. A method for manufacturing a battery, the method comprising:
providing a first electrically conductive fabric;
electrically coupling a plurality of battery cells in parallel in a two-dimensional matrix on the first electrically conductive fabric;
covering the two-dimensional matrix with a second electrically conductive fabric, wherein each of the first electrically conductive fabric and the second electrically conductive fabric comprises a flexible and sewable material; and
framing the two-dimensional matrix between the first electrically conductive fabric and the second electrically conductive fabric, to prevent direct electrical contact between the first electrically conductive fabric and the second electrically conductive fabric, and to allow the plurality of battery cells to establish electrical connections to the first electrically conductive fabric and the second electrically conductive fabric.

15. The method of claim 14, further comprising:
electrically coupling a first terminal to the first electrically conductive fabric; and
electrically coupling a second terminal to the second electrically conductive fabric.

16. The method of claim 14, wherein the framing comprises affixing an electrically insulating material between the first electrically conductive fabric and the second electrically conductive fabric to enclose the two-dimensional matrix.

17. The method of claim 16, wherein the affixing comprises sewing the electrically insulating material between the first electrically conductive fabric and the second electrically conductive fabric within an attachment region.

18. The method of claim 14, further comprising integrating the battery into a garment.

* * * * *